United States Patent
Higashi et al.

(10) Patent No.: US 6,825,055 B2
(45) Date of Patent: Nov. 30, 2004

(54) METHOD FOR ASSEMBLING INTEGRAL TYPE ELECTRONIC COMPONENT AND INTEGRAL TYPE ELECTRONIC COMPONENT

(75) Inventors: Kazushi Higashi, Neyagawa (JP); Hiroyuki Otani, Ikoma (JP); Norihito Tsukahara, Kyoto-fu (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 39 days.

(21) Appl. No.: 09/940,876

(22) Filed: Aug. 29, 2001

(65) Prior Publication Data

US 2002/0028595 A1 Mar. 7, 2002

(30) Foreign Application Priority Data

Aug. 29, 2000 (JP) .......................... 2000-259131

(51) Int. Cl.⁷ .................. H01L 21/00; H01L 21/44; H01L 21/48; H01L 21/50; H01L 21/30
(52) U.S. Cl. ..................... 438/25; 438/26; 438/27; 438/28; 438/107; 438/109; 438/126; 438/456
(58) Field of Search .................. 438/25–28, 107–109, 438/126, 456

(56) References Cited

U.S. PATENT DOCUMENTS

| | | | | |
|---|---|---|---|---|
| 4,722,914 A | * | 2/1988 | Drye et al. | 438/107 |
| 4,778,253 A | * | 10/1988 | Siga et al. | 359/819 |
| 5,198,963 A | * | 3/1993 | Gupta et al. | 361/715 |
| 5,561,594 A | | 10/1996 | Wakefield | |
| 5,608,262 A | * | 3/1997 | Degani et al. | 257/723 |
| 5,646,828 A | * | 7/1997 | Degani et al. | 361/715 |
| 5,760,478 A | * | 6/1998 | Bozso et al. | 257/777 |
| 5,963,429 A | * | 10/1999 | Chen | 361/764 |
| 6,084,308 A | * | 7/2000 | Kelkar et al. | 257/777 |
| 6,159,767 A | * | 12/2000 | Eichelberger | 438/107 |
| 6,207,728 B1 | * | 3/2001 | Sekiguchi et al. | 522/83 |
| 6,220,499 B1 | * | 4/2001 | Brofman et al. | 228/180.22 |
| 6,255,899 B1 | * | 7/2001 | Bertin et al. | 327/564 |
| 6,291,267 B1 | * | 9/2001 | Dore et al. | 438/108 |
| 6,294,407 B1 | * | 9/2001 | Jacobs | 438/118 |
| 6,333,522 B1 | * | 12/2001 | Inoue et al. | 257/99 |
| 6,356,686 B1 | * | 3/2002 | Kuczynski | 385/39 |
| 6,445,001 B2 | * | 9/2002 | Yoshida | 257/48 |
| 6,452,278 B1 | * | 9/2002 | DiCaprio et al. | 257/777 |

FOREIGN PATENT DOCUMENTS

JP          09-050767          2/1997

* cited by examiner

Primary Examiner—David E. Graybill
(74) Attorney, Agent, or Firm—Wenderoth, Lind & Ponack, L.L.P.

(57) ABSTRACT

An integral type electronic component is formed of a first board and a second board by storing and holding electronic components to component storage parts of the first board and electrically connecting the second board to the electronic components. An arrangement accuracy of the electronic components is determined on the basis of an arrangement accuracy of the component storage parts, and the electronic components stored in the component storage parts are limited in motion. The electronic components can be arranged highly accurately and simply at low costs in a short time in comparison with the conventional art by being simply inserted to the component storage parts.

13 Claims, 4 Drawing Sheets

METHOD FOR ASSEMBLING INTEGRAL TYPE ELECTRONIC COMPONENT AND INTEGRAL TYPE ELECTRONIC COMPONENT

BACKGROUND OF THE INVENTION

The present invention relates to a method for assembling an integral type electronic component which is manufactured by combining a plurality of electronic components in one body, and an integral type electronic component assembled by the method.

In response to the recent advancement of making electronic components small and light-weight, there has been proposed a large number of ways to further miniaturize the electronic components. Many of the electronic components manufactured by the proposed ways are formed by combining an electronic component having two or more functions with a device having one function.

Various mounting processes and facilities have been developed hitherto to arrange the electronic components highly accurately with high reliability. A conventional method of assembling the electronic components will be described below with reference to FIGS. 8–11.

In the first place, conductive adhesive 2 are supplied onto a board 1 as shown in FIG. 8. Then electronic components 3 are placed to parts of the conductive adhesive 2 as shown in FIG. 9 and fixed to the conductive adhesive 2 with hardening the conductive adhesive 2. After conductive adhesive 4 are supplied onto the electronic components 3 as shown in FIG. 10, a board 5 is placed on the conductive adhesive 4 as shown in FIG. 11. The conductive adhesive 4 are hardened last, whereby an integral type electronic component 6 is formed.

In the conventional arrangement of the above-described manner, the method requires mounting each of the components onto the board 1 and therefore is not fit for devices requiring a mounting accuracy, for example, in mounting optical components necessitating an optical path alignment, etc. The electronic components 3 undesirably vary in height from the board 1 because the electronic components 3 are placed on the conductive adhesive 2. As a result, when the board 5 is mounted onto the electronic components 3 in the next process, the so-called open fault that the electronic components 3 and the board 5 are not electrically connected with each other possibly arises. Further in the case where there are many electronic components 3 to be mounted, it takes a long time before all the components 3 are mounted completely, and also there are problems that a quality of mounting the components on the conductive adhesive 2 deteriorates and a cost increases because of a long manufacturing time.

SUMMARY OF THE INVENTION

The present invention is devised to solve the above problems and has for its object to provide an easy, high-quality and low-cost method for assembling integral type electronic component and an integral type electronic component assembled by the method.

In order to accomplish the above and other aspects, there is provided a method for assembling an integral type electronic component according to a first aspect of the present invention, which comprises:

storing and holding an electronic component to a component storage part of a first board; and electrically connecting a second board to the electronic component held to the first board, thereby forming the integral type electronic component of the first board and the second board.

Bumps of the second board may be flattened before the second board is electrically connected to the electronic component after the electronic component is held to the first board.

An integral type electronic component is provided according to a second aspect of the present invention, which comprises:

a first board with a component storage part for storing and holding an electronic component; and a second board which is electrically connected to the electronic component held to the first board, thereby being united with the first board.

In the second aspect, when the electronic component is a light-emitting element, the component storage part may be formed to have a side wall for shielding light of the light-emitting element.

In the second aspect, the first board can be formed of any one of glass, ceramic and an organic resin.

In the second aspect, the electronic component may be held to the component storage part with a photo-curing type insulating resin.

According to the assembling method for the integral type electronic component of the first aspect of the present invention and the integral type electronic component of the second aspect, the second board is electrically connected to the electronic components after the electronic components are stored and held to the component storage parts of the first board. Therefore, the arrangement accuracy of the electronic components is determined on the basis of the arrangement accuracy of the component storage parts formed to the first board. Also, the electronic components stored in the component storage parts are restricted in motion. Furthermore, since it is enough simple to insert the electronic components to the component storage parts, a long time is not required to finish the mounting as compared with the conventional art even if a lot of electronic components are to be mounted. The manufacturing time is shortened and costs can be reduced in comparison with the conventional art.

The electronic components can be arranged highly accurately and simply at low costs in comparison with the conventional art.

The so-called open fault can be avoided by flattening the bumps of the second board.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
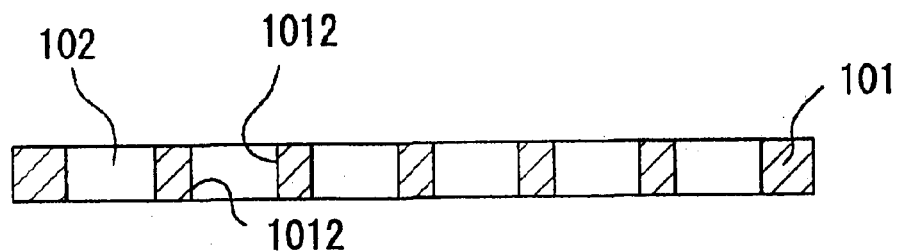
FIG. 1 is a sectional view of a first board among diagrams showing each of states of board and the like which is obtained by carrying out a method for assembling integral type electronic component according to an embodiment of the present invention.

A method for assembling integral type electronic component, and an integral type electronic component assembled by the integral type electronic component assembling method which are embodiments of the present invention will be described below with reference to the drawings. Before the description of the present invention proceeds, it is to be noted that like parts are designated by like reference numerals.

The integral type electronic component assembling method is carried out in a manner as will be discussed below.

Figure 7:
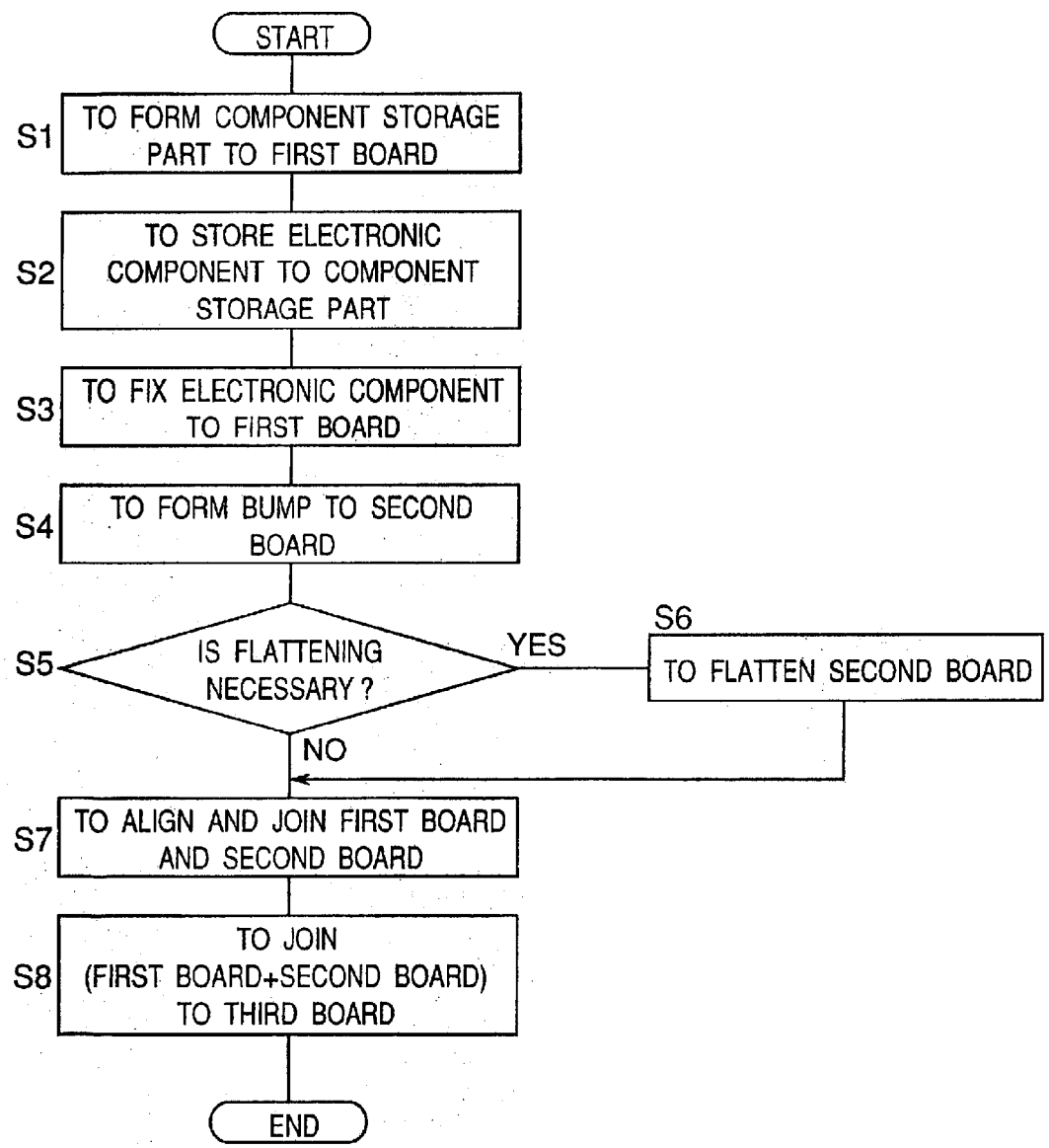
FIG. 7 is a flow chart explanatory of the method for assembling integral type electronic component in the embodiment of the present invention.
Figure 8:
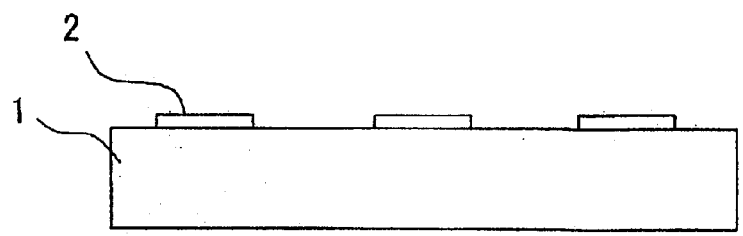
FIG. 8 is a diagram showing a state with a conductive adhesive supplied to a board among diagrams showing each of states of board and the like which is obtained by carrying out a conventional method for assembling integral type electronic component.
Figure 9:
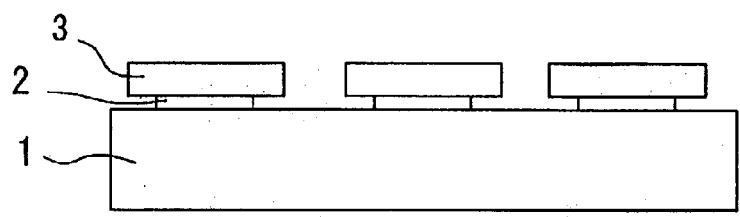
FIG. 9 is a diagram of a state with components mounted to the conductive adhesive of FIG. 8.
Figure 10:
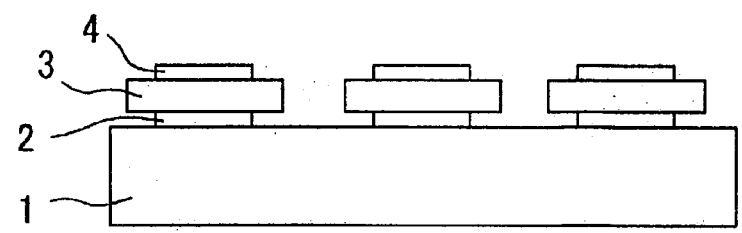
FIG. 10 is a diagram of a state with a conductive adhesive supplied to upper parts of components of FIG. 9.
Figure 11:
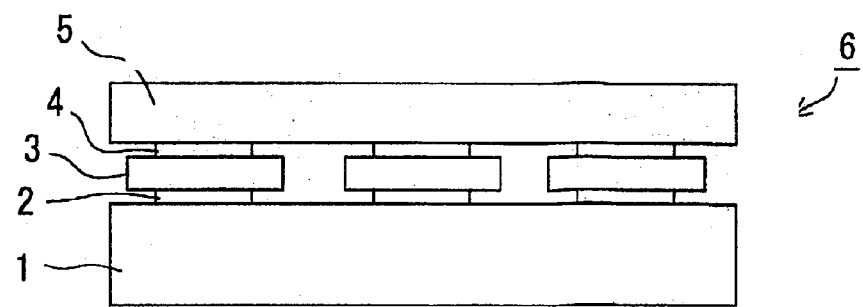
FIG. 11 is a diagram of a state with a board mounted to an upper part of the conductive adhesive of FIG. 10.

In a step (designated by "S" in FIG. 7) 1 of FIG. 7, component storage parts 102 are formed by dry etching or wet etching to a first board 101 as shown in FIG. 1. Each of the component storage parts 102 is a recessed part in which an electronic component 103 to be described below can be stored. Each component storage part may be a bottomed shape or can be, e.g., a through hole penetrating in a thickness direction of the first board 101 as indicated in FIG. 1. Although a plurality of the component storage parts 102 are formed to the first board 101 in FIG. 1, there may be formed one storage part from a relationship with the electronic component 103 to be stored. The component storage part 102 is necessary to be larger by, for instance, 5–30 μm than the electronic component 103 to be stored. For example, an Si substrate, a glass substrate, a ceramic substrate, an organic resin material substrate or the like is used as the first board 101.

A crystal orientation of Si may be any of (1,1,1), (1,0,0) and (1,1,0) when the Si substrate is used.

Figure 2:
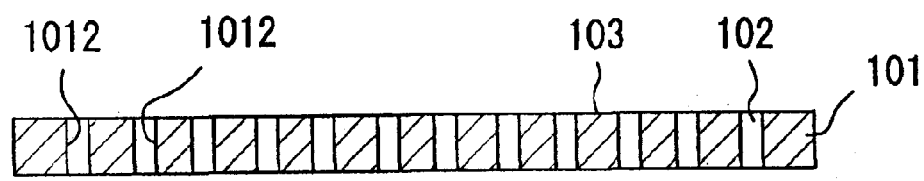
FIG. 2 is a sectional view of the first board indicating a state with electronic components filled in component storage parts of the first board shown in FIG. 1.

In a next step 2, as shown in FIG. 2, the electronic components 103 are disposed to the component storage parts 102. The electronic component 103 corresponds to, for example, a light-emitting element such as an LED (light-emitting diode) or the like, an IC of Si substrate, an IC of GaAs substrate, a resistor, a capacitor or the like. For the electronic component 103 being, e.g., the LED, an orientation of the LED is controlled by a mounting machine having a recognition function, so that the LED is stored in the component storage part 102 with a light-emitting part of the LED directed down in the drawing. Although the electronic components 103 are placed to all of the component storage parts 102 in FIG. 2, the present embodiment is not limited to this arrangement and the electronic component(s) 103 is sometimes placed to only part of the component storage parts 102 in relation to a circuit design.

When the electronic component 103 is a light-emitting element such as an LED or the like, the component storage part 102 may be formed to have a side wall 1012 for shielding light of the light-emitting element. The side wall 1012 can prevent, for example, interference due to light emitted from an adjoining LED from arising.

Figure 3:
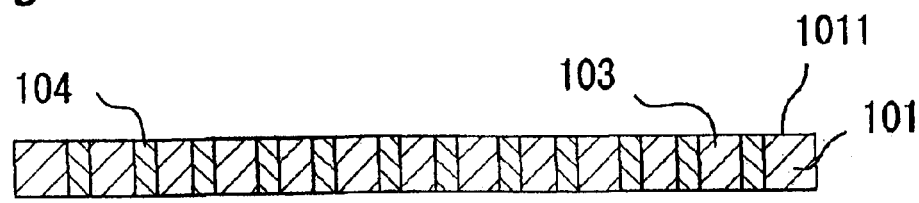
FIG. 3 is a sectional view of the first board indicating a state in which electronic components filled in the first board of FIG. 1 are fixed with an adhesive.

In a succeeding step 3, as in FIG. 3, an insulating adhesive 104 is filled and then cured in the component storage part 102 with the electronic component 103 stored therein. An adhesive of a type cured with ultraviolet rays, a thermosetting type adhesive or the like can be used as an example of the insulating adhesive 104. When the adhesive to be cured with ultraviolet rays is used, for instance, the adhesive is cured by applying ultraviolet rays after the adhesive is filled.

In a next step 4, gold bumps 106 are formed correspondingly to the electronic components 103 to a second board 105 which is to be electrically connected to the electronic components 103. In a next step 5, it is decided whether or not leading end parts of the gold bumps 106 of the second board 105 are to be flattened. When the flattening is determined to be necessary, the step goes to a next step 6 and the flattening is carried out. Then the step moves to a next step 7. On the other hand, when the flattening is determined to be unnecessary, the step skips to the step 7. Whether the flattening is necessary or not may be judged by a worker.

Figure 4:
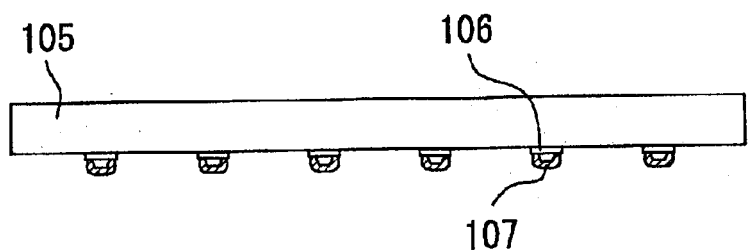
FIG. 4 is a side view of a second board to be fitted to the first board of FIG. 1.
Figure 5:
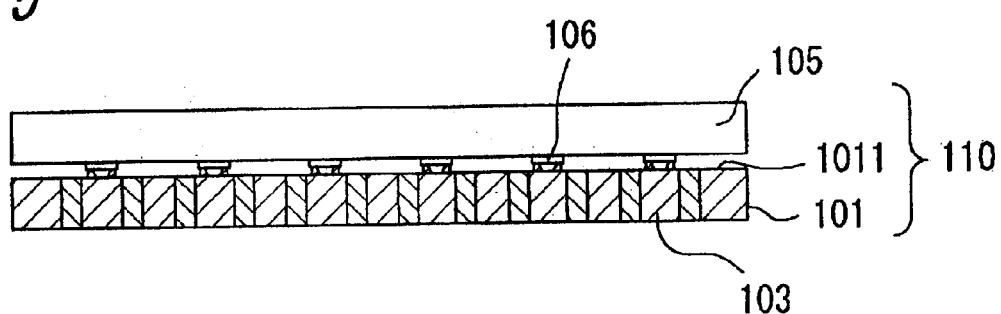
FIG. 5 is a diagram showing a state in which the first board of FIG. 3 and the second board of FIG. 4 are joined.

In the step 7 as shown in FIG. 4, a conductive adhesive 107 is applied to the leading end parts of the gold bumps 106 of the second board 105. The second board 105 may be a semiconductor chip of, e.g., Si, GaAs, InP or the like. In the step 7, the first board 101 with the electronic components 103 and the second board 105 with the gold bumps 106 are aligned to make the electronic components 103 and the gold bumps 106 meet each other, as indicated in FIG. 5. Then the first board 101 and the second board 105 are fitted. After the fitting, the conductive adhesive 107 is cured thereby joining the first board 101 and the second board 105. A first integral type electronic component 110 is formed in this manner.

Figure 6:
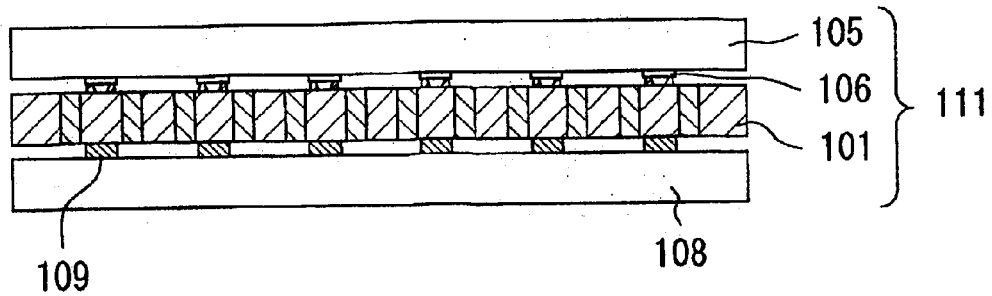
FIG. 6 is a diagram of a state in which a third board is joined to the board obtained by joining the first board and the second board.

According to the present embodiment, further in a step 8, a third board 108 is joined with a conductive adhesive 109 to the above-joined first board 101 and second board 105. A second integral type electronic component 111 may be formed accordingly as shown in FIG. 6.

The assembling method for the integral type electronic component, and the integral type electronic component assembled by the method can exert the following effects. It has conventionally been the problem in the circumstances without the first board 101 how to assemble small components while fixedly transferring the components. That is, a process related to the arranging and fixing the components has been complicated in the conventional art, thereby raising problems of a yield decrease, etc. In contrast to this, according to the present embodiment, an arrangement accuracy of electronic components 103 is determined on the basis of an arrangement accuracy of component storage parts 102 formed to the first board 101. Moreover, the electronic components 103 stored in the component storage parts 102 are limited in motion. In order to arrange the electronic components 103, it is enough only to insert the electronic components 103 to the component storage parts 102. The arrangement is thus made simple. It won't take a long time before an end of the mounting as compared with the conventional art even if there is a large number of electronic components 103 to be mounted. The manufacturing time is shortened and costs can be reduced in comparison with the conventional art.

The arrangement of the electronic components 103 is realized highly accurately and simply at low costs in comparison with the conventional art.

Additionally, the open fault is prevented because the bumps 106 of the second board 105 are flattened.

Although the present invention has been fully described in connection with the preferred embodiment thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method for assembling an integral electronic device, comprising:
   holding a plurality of LEDs in openings that extend comoletely through a thickness of a first board, with each of said openings
   (i) being defined by a side wall that is capable of shielding light emitted from a corresponding one of said plurality of LEDs,
   (ii) being defined so as to limit movement of said corresponding one of said plurality of LEDs within the opening, and
   (iii) having an arrangement accuracy corresponding to an arrangement accuracy required of said corresponding one of said plurality of said LEDs; and
   electrically connecting a second board to said plurality of LEDs, thereby providing an integral electronic device including said first board, said plurality of LEDs and said second board.

2. The method according to claim 1, wherein electrically connecting a second board to said plurality of LEDs comprises electrically connecting said second board to said plurality of LEDs via flat metallic bumps.

3. The method according to claim 2, wherein electrically connecting said second board to said plurality of LEDs via flat metallic bumps comprises flattening metallic bumps that are on said second board and then connecting said metallic bumps to said plurality of LEDs.

4. The method according to claim 1, wherein holding said plurality of LEDs in said openings comprises holding said plurality of LEDs in openings of a board of any one of glass, ceramic and an organic resin.

5. The method according to claim 1, wherein holding said said plurality of LEDs in said openings comprises holding said plurality of LEDs in said openings via a photo-curing insulating resin.

6. The method according to claim 3, wherein holding said plurality of LEDs in said openings comprises holding said plurality of LEDs in said openings via a photo-curing insulating resin.

7. The method according to claim 4, wherein holding said plurality of LEDs in said openings comprises holding said plurality of LEDs in said openings via a photo-curing insulating resin.

8. The method according to claim 3, wherein holding said plurality of LEDs in said openings comprises holding said plurality of LEDs in said openings of a board of any one of glass, ceramic and an organic resin.

9. The method according to claim 8, wherein holding said plurality of LEDs in said openings comprises holding said plurality of LEDs in said openings via a photo-curing insulating resin.

10. The method according to claim 1, wherein holding said plurality of LEDs in said openings comprises holding said plurality of LEDs in said openings via an insulating resin that surrounds each of said plurality of LEDs except for upper and lower surfaces of said each of said plurality of LEDs.

11. The method according to claim 10, wherein electrically connecting a second board to said plurality of LEDs comprises electrically connecting said second board to said upper surfaces of said each of said plurality of LEDs, said method further comprising:
   electrically connecting a third board to said lower surfaces of said each of said plurality of LEDs.

12. The method according to claim 1, further comprising:
   in another opening that extends completely through the thickness of said first board, holding another LED; and
   electrically connecting said second board to said another LED while said another LED is held in said another opening,
   wherein said openings and said another opening are parallel to one another.

13. The method according to claim 1, wherein electrically connecting a second board to said plurality of LEDs comprises electrically connecting said second board to said plurality of LEDs while said plurality of LEDs is held in said openings.

* * * * *